(12) United States Patent
Zhang et al.

(10) Patent No.: US 12,733,169 B2
(45) Date of Patent: Sep. 8, 2026

(54) BARRIER AND THIN SPACER FOR 3D-NAND COMPLEMENTARY METAL-OXIDE SEMICONDUCTOR UNDER ARRAY

(71) Applicant: Intel NDTM US LLC, Santa Clara, CA (US)

(72) Inventors: Yi Zhang, Da Lian (CN); Hongxiang Mo, Da Lian (CN); Tony Zengtao Liu, Eagle, ID (US)

(73) Assignee: INTEL NDTM US LLC, Santa Clara, CA (US)

( * ) Notice: Subject to any disclaimer, the term of this patent is extended or adjusted under 35 U.S.C. 154(b) by 214 days.

(21) Appl. No.: 17/817,362

(22) Filed: Aug. 4, 2022

(65) Prior Publication Data

US 2022/0375946 A1 Nov. 24, 2022

(51) Int. Cl.

*H10B 43/35* (2023.01)
*H10B 41/27* (2023.01)
*H10B 41/35* (2023.01)
*H10B 43/27* (2023.01)

(52) U.S. Cl.

CPC ............. *H10B 43/35* (2023.02); *H10B 41/27* (2023.02); *H10B 41/35* (2023.02); *H10B 43/27* (2023.02)

(58) Field of Classification Search

CPC ........ H10B 41/27; H10B 41/35; H10B 43/27; H10B 43/35

See application file for complete search history.

(56) References Cited

U.S. PATENT DOCUMENTS 4,774,201 A * 9/1988 Woo .................. H01L 21/32105 438/303
5,981,320 A * 11/1999 Lee .................... H10D 84/0174 257/369
10,355,017 B1 * 7/2019 Nakatsuji ............ H01L 21/0217
2004/0188772 A1 * 9/2004 Blosse ................. H10D 64/664 257/E29.255
2013/0320450 A1 * 12/2013 Hoentschel ........ H10D 84/0184 438/303
2019/0043874 A1 * 2/2019 Thimmegowda ........ G11C 8/14

FOREIGN PATENT DOCUMENTS

JP H02192161 A * 7/1990 ............. H01L 29/73
KR 19990083380 A * 11/1999 ............. H01L 29/78

OTHER PUBLICATIONS

Drynan, John M., et al., "TiN as a Phosphorous Outdiffusion Barrier Layer for WSix/Doped-Polysilicon Structures", IEICE Transactions on Electronics, vol. E76-C, No. 4 (Year: 1993).*

Wakabayashi, Hitoshi, et al., "Ultralow Resistance W/Poly-Si Gate CMOS Technology Using Amorphous-Si/TiN Buffer Layer", IEEE Transactions on Electron Devices, vol. 49, No. 2, pp. 295-300 (Year: 2002).*

* cited by examiner

*Primary Examiner* — Fernando L Toledo
*Assistant Examiner* — Ryan T. Fortin
(74) *Attorney, Agent, or Firm* — Morgan, Lewis & Bockius LLP

(57) ABSTRACT

Systems, apparatuses, and methods may provide for technology for forming a gate polysilicon for 3D-NAND complementary metal-oxide semiconductor under array (CuA) on a substrate with a barrier and spacer structure. For example, the technology includes forming a titanium nitride (TiN) barrier adjacent the gate polysilicon and forming a silicon nitride (SiN) spacer around the polysilicon gate and the titanium nitride barrier.

20 Claims, 12 Drawing Sheets

600

BARRIER AND THIN SPACER FOR 3D-NAND COMPLEMENTARY METAL-OXIDE SEMICONDUCTOR UNDER ARRAY

CROSS-REFERENCE TO RELATED APPLICATIONS

This application claims the benefit of priority to International Application No. PCT/CN2022/104376, filed on Jul. 7, 2022.

TECHNICAL FIELD

Embodiments generally relate to memory structures. More particularly, embodiments relate to forming a barrier and spacer structure for a gate polysilicon layer (poly) in a 3D-NAND complementary metal-oxide semiconductor under array (CuA) memory structure.

BACKGROUND

Three-dimensional (3D) NAND technologies are commonly used to create nonvolatile (NV) storage devices, such as solid state drives (SSDs). Reference to 3D NAND can more specifically refer to NAND flash.

NAND-type flash memory ("NAND memory") may be organized into multiple cells, with each cell containing one or more bits of data and being accessible through an array of bit lines (columns) and word lines (rows). With 3D NAND processes, the storage array is often created with the word lines (WL) in a staircase structure, with vertical connector pillars connecting a top connection layer to the word lines.

Increased 3D NAND densities are achieved with smaller process geometries and feature spacing. With the increase of number of tiers or word lines in 3D NAND in every generation, the number of WL contacts is also going up, requiring more routing paths to hook up the word line contacts to corresponding complementary metal-oxide-semiconductor (CMOS) devices.

In 3D-NAND, higher performance complementary metal-oxide semiconductor (CMOS) under array (CuA) is often required to achieve higher Input/Output (IO) speed and lower power consumption. But for P-channel metal-oxide semiconductor (PMOS), especially post high temperature thermal in cell flow, the boron (B) in a polysilicon layer (poly) is very easy to out diffuse. In response, in CMOS under array (CUA) architecture types used in 3D NAND, existing methods to avoid polysilicon depletion typically involve replacing a doped polysilicon layer (poly) by metal. Then the polysilicon depletion effect can be eliminated.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

As described above, in 3D-NAND, higher performance complementary metal-oxide semiconductor (CMOS) under array (CuA) is often required to achieve higher Input/Output (IO) speed and lower power consumption. But for P-channel metal-oxide semiconductor (PMOS), especially post high temperature thermal in cell flow, the boron (B) in a polysilicon layer (poly) is very easy to out diffuse to tungsten silicide (WSix). Disadvantageously, such a situation will enhance the polysilicon depletion effect and result in thicker equivalent oxide thickness and lower gate oxide capacitance. This type of result adversely affects the device performance.

As described above, classical methods to address polysilicon depletion is to replace the doped polysilicon by metal. In such methods, the polysilicon depletion effect can be reduced or eliminated. However, such classical method may require the adaptation of new materials and new process flows. Additionally, the metal gate usually can't tolerate the high temperature thermal in cell loop.

As will be described in greater detail below, systems, apparatuses, and methods are described that may provide for technology for forming a barrier and a thin spacer around a polysilicon control gate to prevent B out diffuse in polysilicon PMOS for 3D-NAND CuA. For example, a titanium nitride (TiN) barrier and a silicon nitride (SiN) thin spacer are utilized in some implementations around polysilicon control gate to prevent B out diffuse in polysilicon PMOS for 3D-NAND CuA.

In some implementations, the use of a TiN barrier prevents a polysilicon depletion. However, use of a TiN as a barrier presents a problem of TiN gate protrusion. In order to address this challenge, a thin spacer is employed in some implementations. Advantageously, a SiN thin spacer is used to protect the TiN and prevent the polysilicon depletion in a transverse direction to prevent such a TiN protrusion.

In operation, some implementations involve: adding one TiN on top of polysilicon as a barrier to prevent the B out diffuse to Wsix and to reduce the polysilicon depletion effect, adding a thin 50-100A SiN spacer (e.g., a single spacer) around the gate to prevent the B transverse diffuse, and the thin SiN spacer can also prevent the TiN protrusion post high temperature thermal.

Advantageously, some implementations herein reduce polysilicon depletion effect and improve PMOS (e.g., with about a 17% performance boost). Additionally, or alternatively, some implementations herein provide an improved user experience and improved performance through improved High Input/Output speed and/or decreased power consumption.

Figure 1:
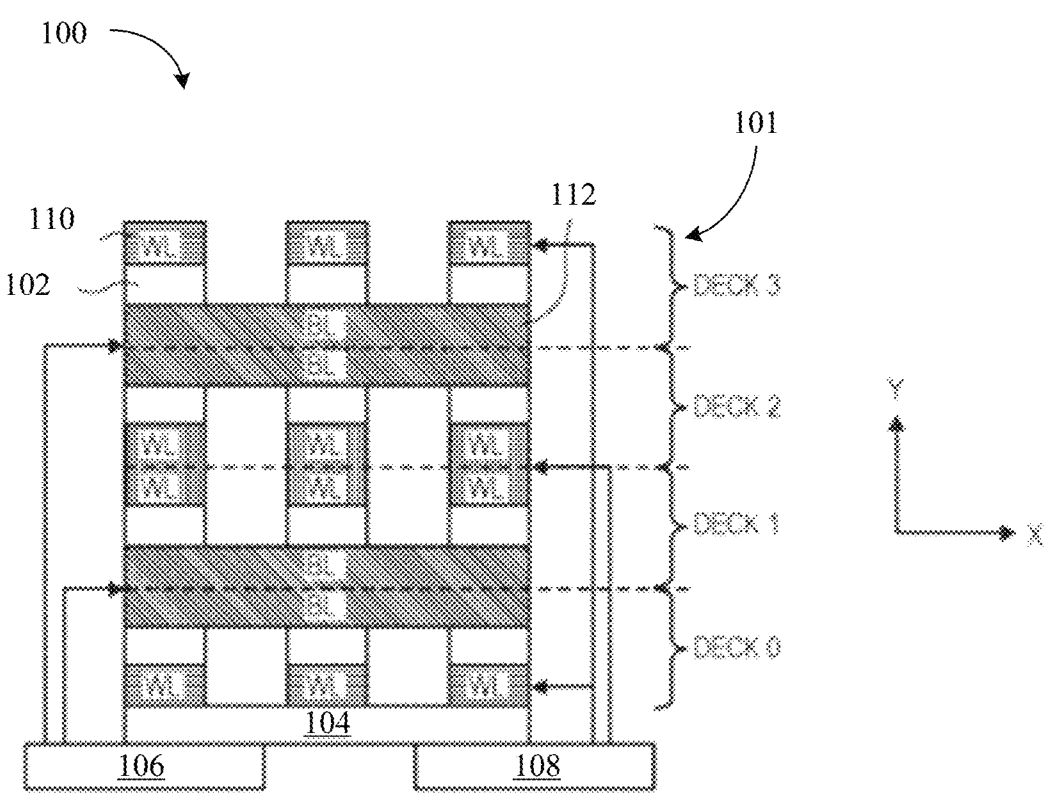
FIG. 1 is a block diagram of an example of a multi-deck non-volatile memory device according to an embodiment.

FIG. 1 is a simplified block diagram of an example of a memory device 100 according to an embodiment. As illustrated, the memory device 100 is a multi-deck non-volatile memory device including a plurality of decks 101 (e.g., Deck 0, Deck 1, Deck 2, and Deck 3, or the like).

In some implementations, each of the decks 101 may include an array of memory cells 102 with conductive access lines (e.g., word lines 110 and bitlines 112). For example, the memory cells 102 may include a material capable of being in two or more stable states to store a logic value. In one example, the memory cells 102 may include a phase change material, a chalcogenide material, the like, or combinations thereof. However, any suitable storage material may be utilized. The word lines 110 and bitlines 112 may be patterned so that the word lines 110 are orthogonal to the bitlines 112, creating a grid pattern or "cross-points." A cross-point is an intersection between a bitline, a word line, and active material(s) (e.g., a selector and/or a storage material). A memory cell 102 may be located at the intersection of a bitline 112 and a word line 110. Accordingly, one or more of the decks 101 may include a crosspoint array of non-volatile memory cells, where each of the memory cells may include a material capable of being in two or more stable states to store a logic value.

As illustrated, an electrically isolating material 104 may separate the conductive access lines (e.g., word lines 110 and bitlines 112) of the bottom deck (e.g., deck 0) from bitline sockets 106 and word line sockets 108. For example, the memory cells 102 may be coupled with access and control circuitry for operation of the three-dimensional memory device 100 via the bitline sockets 106 and the word line sockets 108.

Examples of multi-deck or multi-layer memory architectures include multi-deck crosspoint memory and 3D NAND memory. Different memory technologies have adopted different terminology. For example, a deck in a crosspoint memory device typically refers to a layer of memory cell stacks that can be individually addressed. In contrast, a 3D NAND memory device is typically said to include a NAND array that includes many layers, as opposed to decks. In 3D NAND, a deck may refer to a subset of layers of memory cells (e.g., two decks of X-layers to effectively provide a 2X-layer NAND device). The term "deck" will be used throughout this disclosure to describe a layer, a tier, or a similar portion of a three-dimensional memory.

The memory device 100 may include non-volatile memory and/or volatile memory. Non-volatile memory is a storage medium that does not require power to maintain the state of data stored by the medium. In one embodiment, the memory structure is a block addressable storage device, such as those based on NAND or NOR technologies. A storage device may also include future generation nonvolatile devices, such as a three-dimensional (3D) crosspoint memory device, or other byte addressable write-in-place nonvolatile memory devices. In one embodiment, the storage device may be or may include memory devices that use silicon-oxide-nitride-oxide-silicon (SONOS) memory, electrically erasable programmable read-only memory (EEPROM), chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The term "storage device" may refer to the die itself and/or to a packaged memory product. In some embodiments, 3D crosspoint memory may comprise a transistor-less stackable cross point architecture in which memory cells sit at the intersection of word lines and bit lines and are individually addressable and in which bit storage is based on a change in bulk resistance. In particular embodiments, a memory module with non-volatile memory may comply with one or more standards promulgated by the Joint Electron Device Engineering Council (JEDEC), such as JESD235, JESD218, JESD219, JESD220-1, JESD223B, JESD223-1, or other suitable standard (the JEDEC standards cited herein are available at jedec.org).

Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of the memory modules complies with a standard promulgated by JEDEC, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at j edec.org). Such standards (and similar standards) may be referred to as DDR-based standards and communication interfaces of the storage devices that implement such standards may be referred to as DDR-based interfaces.

The techniques described herein typically may not be limited to crosspoint memory, but other memory devices, including memory devices with one or multiple layers or multiple decks of memory cells.

As will be described in greater detail below, systems, apparatuses and methods of some implementations herein provide for technology that provides the capability to form a gate polysilicon for 3D-NAND CuA on a substrate with a barrier and spacer structure.

Figure 2:
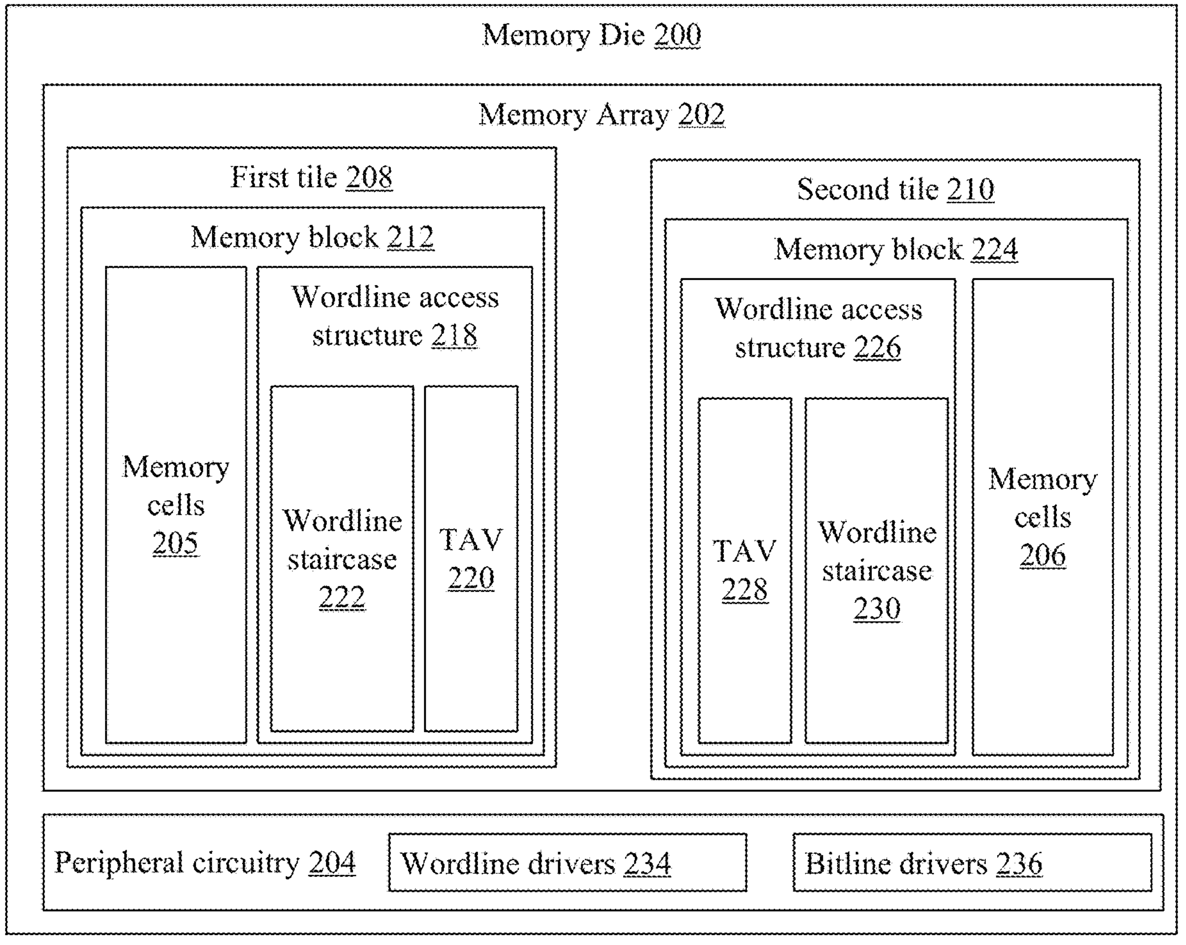
FIG. 2 illustrates an example side view diagram of a memory die according to an embodiment.

FIG. 2 illustrates a simplified example side view diagram of a memory die 200, consistent with one embodiment of the present disclosure. The memory die 200 includes a 3D flash memory architecture and utilizes a word line bridge to share word line access structures between two tiles of a memory array, according to one embodiment.

The memory die 200 includes a memory array 202 and peripheral circuitry 204, according to one embodiment. The memory array 202 includes memory cells 205 and memory cells 206 that are accessed (e.g., read/write) with the peripheral circuitry 204, according to one embodiment. The peripheral circuitry 204 is fabricated at least partially under the memory array 202 in the memory die 200, for example, using complementary metal-oxide semiconductor (CMOS) under array (CuA) fabrication techniques, according to one embodiment.

The memory array 202 is segmented into a first tile 208 and a second tile 210, according to one embodiment. Although two tiles are illustrated and described the memory array 202 may be segmented into 10's or 100's of tiles to facilitate access and operation of the memory array 202, according to one embodiment. The first tile 208 includes a memory block 212, which includes the memory cells 205 and word line access structures 218, according to one embodiment. The word line access structures 218 include through array vias 220 and a word line staircase 222, according to one embodiment. The through array vias 220 connect word lines for the memory cells 205 to the peripheral circuitry 204, under the memory array 202, according to one embodiment. The word line staircase 222 represents a word line staircase structure that may be used to connect the word lines of the memory cells 205 to metal contacts for connection to upper metal levels, according to one embodiment. The word line access structures 218 are illustrated disproportionately large in comparison to the memory cells 205 for illustration purposes. In practice, the memory cells 205 may occupy a significantly larger area in the memory array than the word line access structures 218, according to one embodiment.

The second tile 210 includes a memory block 224, which includes the memory cells 206 and word line access structures 226, according to one embodiment. The word line access structures 226 include through array vias 228 and a word line staircase 230, according to one embodiment. The through array vias 228 pass through the memory block 224 to couple upper metal levels to the peripheral circuitry 204, according to one embodiment. The word line staircase 230 provides landings and/or a structure to which metal contacts connect the word lines of the memory cells 206 to upper metal levels that are on top of or above the memory array 202, according to one embodiment.

The peripheral circuitry 204 includes word line drivers 234 and bitline drivers 236 that drive word lines and bitlines for the memory array 202, according to one embodiment.

As will be described in greater detail below, such peripheral circuitry 204 is fabricated at least partially under the memory array 202 in the memory die 200, for example, using complementary metal-oxide semiconductor (CMOS) under array (CuA) fabrication techniques, according to one embodiment. For example, systems, apparatuses, and methods of some implementations herein provide for technology that forms a PMOS gate stack for 3D-NAND CuA with a barrier and spacer structure to reduce polysilicon control gate depletion. Such technology is implementable in three dimensional (3D) NAND memory and other memory structures.

In some implementations, the memory die 200 includes the memory array 202 and a complementary metal-oxide semiconductor under array (e.g., as represented by peripheral circuitry 204) coupled to the memory array 202. The complementary metal-oxide semiconductor under array (e.g., as represented by peripheral circuitry 204) includes a P-channel metal-oxide semiconductor gate stack on a substrate. In some implementations, such a P-channel metal-oxide semiconductor gate stack includes a polysilicon control gate and a titanium nitride barrier adjacent the polysilicon control gate.

Figures 3A, 3B:
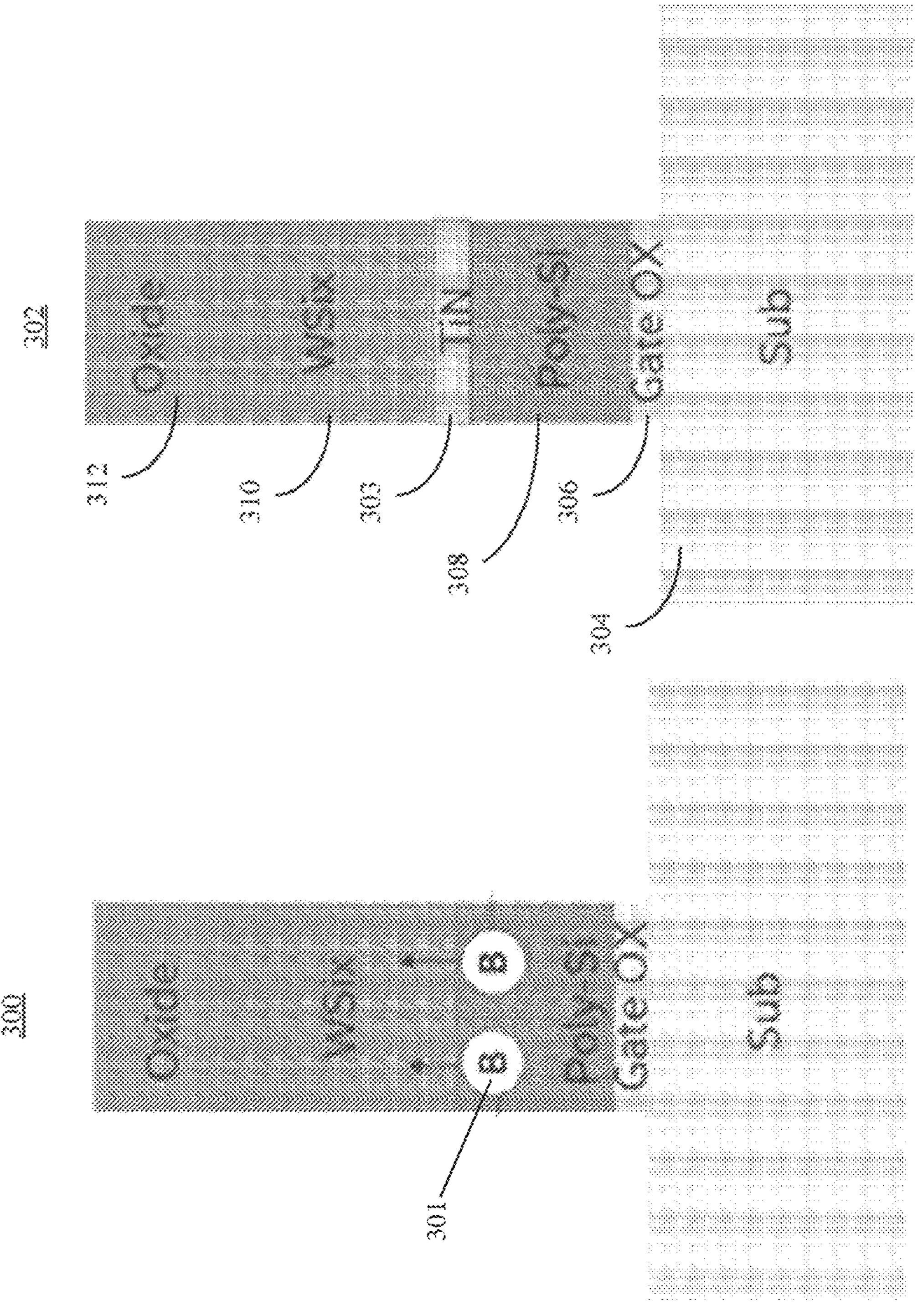
FIGS. 3A and 3B are a diagram to illustrate a comparison of a current PMOS gate stack (in FIG. 1A) and TiN barrier in a PMOS gate stack (in FIG. 1B) according to an embodiment.

FIGS. 3A and 3B illustrate a comparison of a current PMOS gate stack 300 (in FIG. 3A) and a TiN barrier in a PMOS gate stack 302 (in FIG. 3B) according to an embodiment.

As illustrated in FIG. 3A, a current PMOS gate stack 300 in a CuA with doped polysilicon typically suffers from a polysilicon depletion effect due to the diffusion of boron (B) 301 in P-channel metal-oxide semiconductor (PMOS) post array thermal processing. Typically, the polysilicon depletion will affect CMOS performance and result in lower IO speed and higher power consumption.

Conversely, as illustrated in the implementation of FIG. 3B, a barrier 303 is utilized in the PMOS gate stack 302 to prevent the B in polysilicon out diffusion according to an embodiment. In some implementations, the barrier 303 includes titanium nitride (TiN), tungsten nitride (e.g., WN), Ti/TIN, Ti/WN, the like, and/or combinations thereof (e.g., a barrier with a titanium (Ti) portion and a titanium nitride (TiN) portion, or a barrier with a titanium (Ti) portion and a tungsten nitride (e.g., WN) portion, or the like). For example, the barrier 303 is a TiN barrier. Such a barrier 303 has a thickness of a 30-40A, or the like, for example.

In the illustrated example, the PMOS gate stack 302 comprises a sequential set of layers comprising a gate oxide 306 adjacent a substrate 304, a polysilicon control gate 308 adjacent the gate oxide 306, the barrier 303 adjacent the polysilicon control gate 308, a conductive layer 310 adjacent the barrier 303, and an insulation cap 312 adjacent the conductive layer. As illustrated, the barrier 303 is formed between the polysilicon control gate 308 and the conductive layer 310.

Implementations of embodiments described herein may be formed or carried out on the substrate 304, such as a semiconductor substrate. In one implementation, such a semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present description.

As will be described in greater detail below, a plurality of transistors, such as metal-oxide-semiconductor field-effect transistors (MOSFET or simply MOS transistors), may be fabricated on the substrate 304. For example, each MOS transistor includes a gate stack formed of at least two layers, a gate dielectric layer and a gate electrode layer. The gate dielectric layer may include one layer or a stack of layers, for example. The gate electrode layer is formed on the gate dielectric layer and may consist of at least one P-type material or N-type material, depending on whether the transistor is to be a PMOS or an NMOS transistor.

Source and drain regions (not illustrated) are formed within the substrate 304 adjacent to the gate stack of each MOS transistor. Such source and drain regions are generally formed using either an implantation/diffusion process or an etching/deposition process, for example.

In some implementations, the polysilicon control gate 308 is doped with boron, for example. For example, the polysilicon control gate 308 may be formed from in-situ doped polysilicon.

In some examples, the PMOS gate stack 302 includes the conductive layer 310 (e.g., which is referred to herein as a low resistance layer in some instances). Such a conductive layer 310 is utilized as a refinement help to reduce current leakage back down to a low level when the transistor is switched off, while still permitting a current flow from a source to a drain to be as high as possible when the transistor is switched on. In some examples, the conductive layer 310 comprises a tungsten silicide material (WSix), a molybdenum silicide material (e.g., MoSi2), a tantalum silicide material (e.g., TaSi2), a titanium silicide material (e.g., TiSi2), the like, or combinations thereof. For example, the conductive layer 310 comprises a tungsten silicide material (WSix).

In the illustrated example, the insulation cap 312 is formed of an oxide material. In some implementations, the insulation cap 312 includes one or more interlayer dielectrics (ILD) are deposited over the MOS transistors. Such an ILD layer may be formed using one or more dielectric materials, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 4:
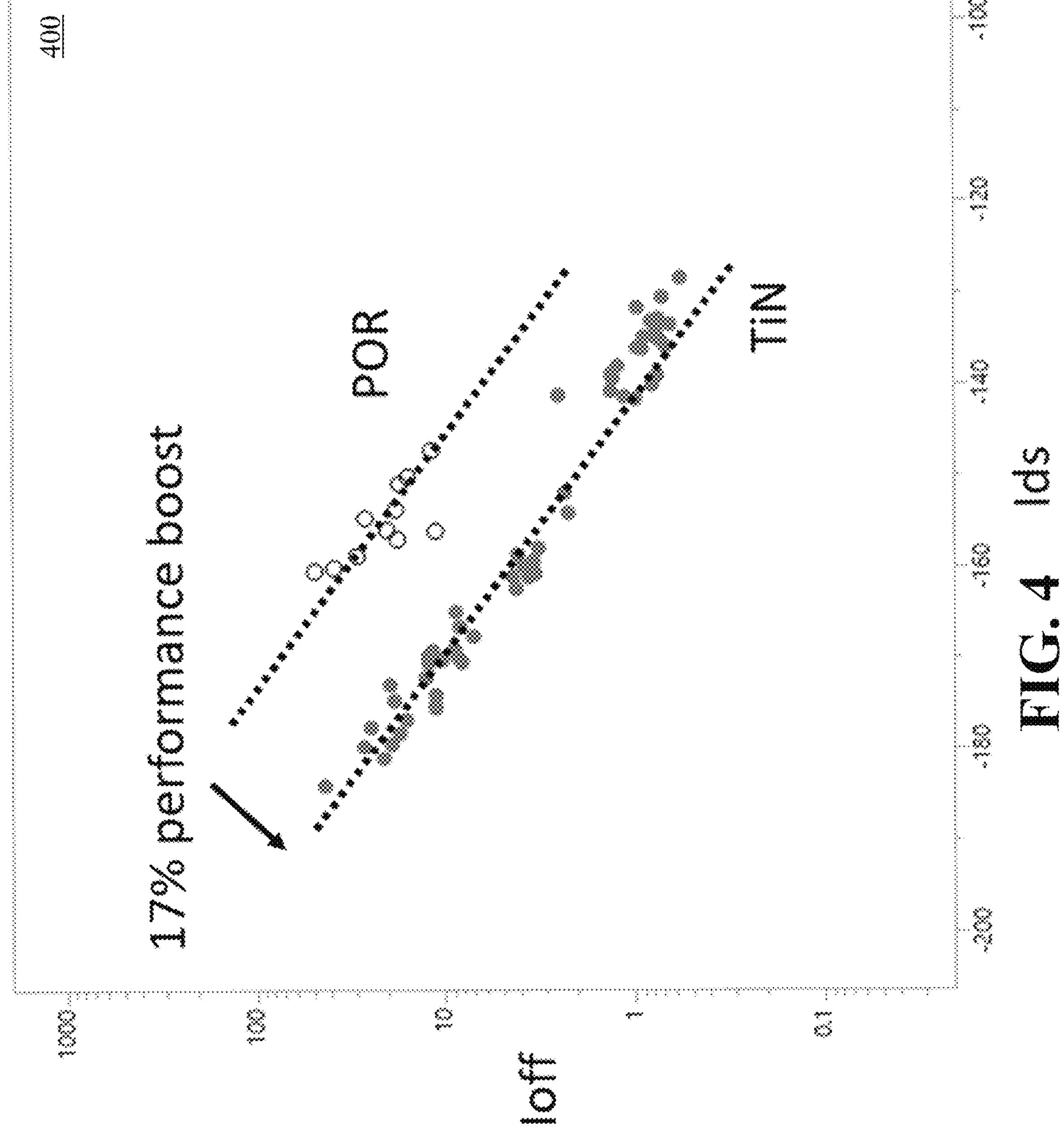
FIGS. 4 and 5 illustrate diagrams of a pair of performance charts according to an embodiment.
Figure 5:
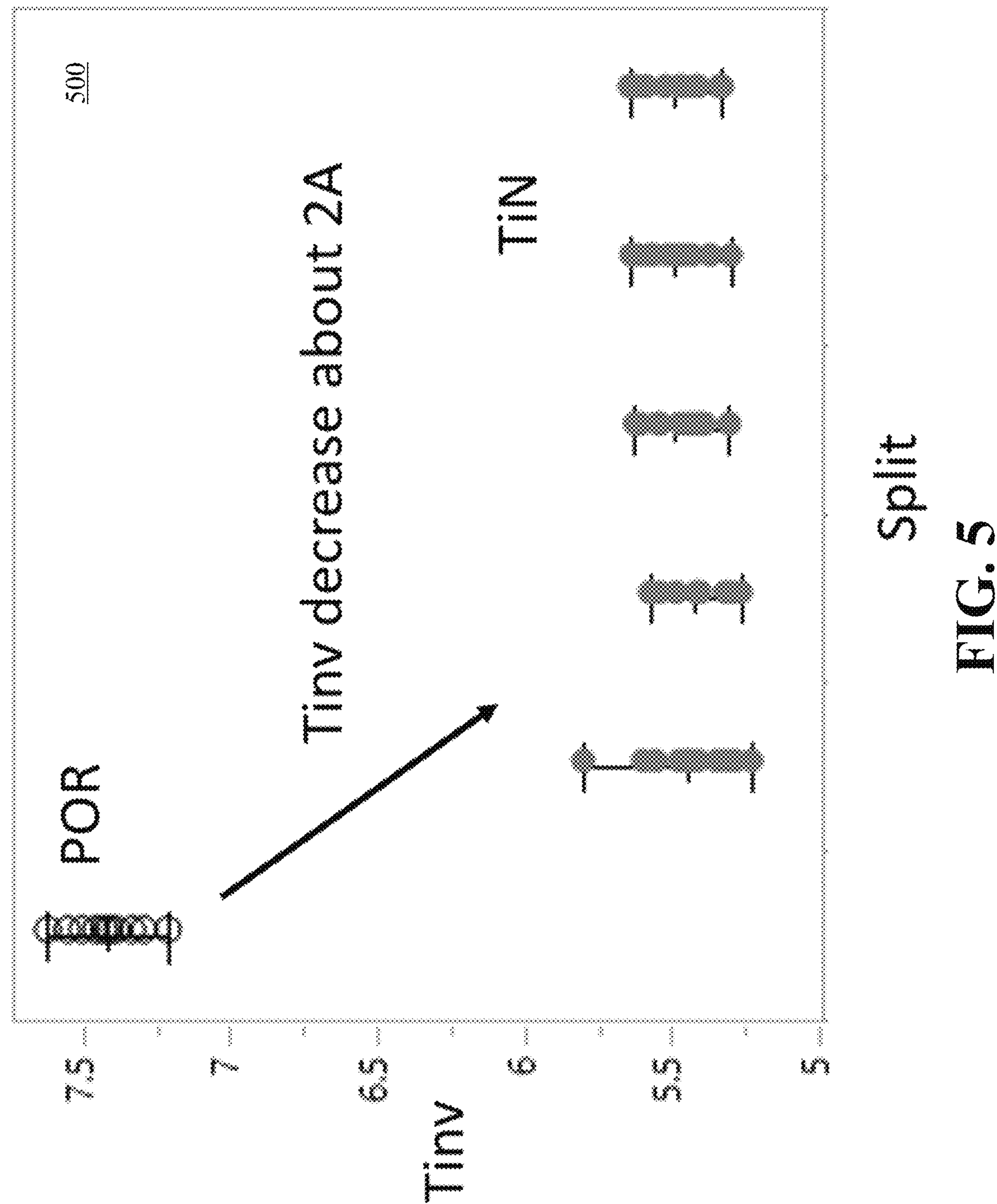

FIGS. 4 and 5 illustrate a pair of performance charts 400 and 500. As illustrated in chart 400, after adding TiN between polysilicon and Wsix, the final param shows 17% PMOS performance boost and Toxe reduced about 2A which verifies a model prediction. As used herein the term "Toxe" refers an electrical equivalent oxide thickness. This includes the Tox+Wdpoly+Tinv, where Wdpoly is the depletion layer thickness in poly. This depletion layer thickness in poly is inversely proportional to poly dose. Because TIN can be a barrier, so can increasing a poly dose as Wdpoly decreases and Tiny decreases. Chart 500 illustrates final parameters after adding TiN between polysilicon and Wsix.

Figure 6:
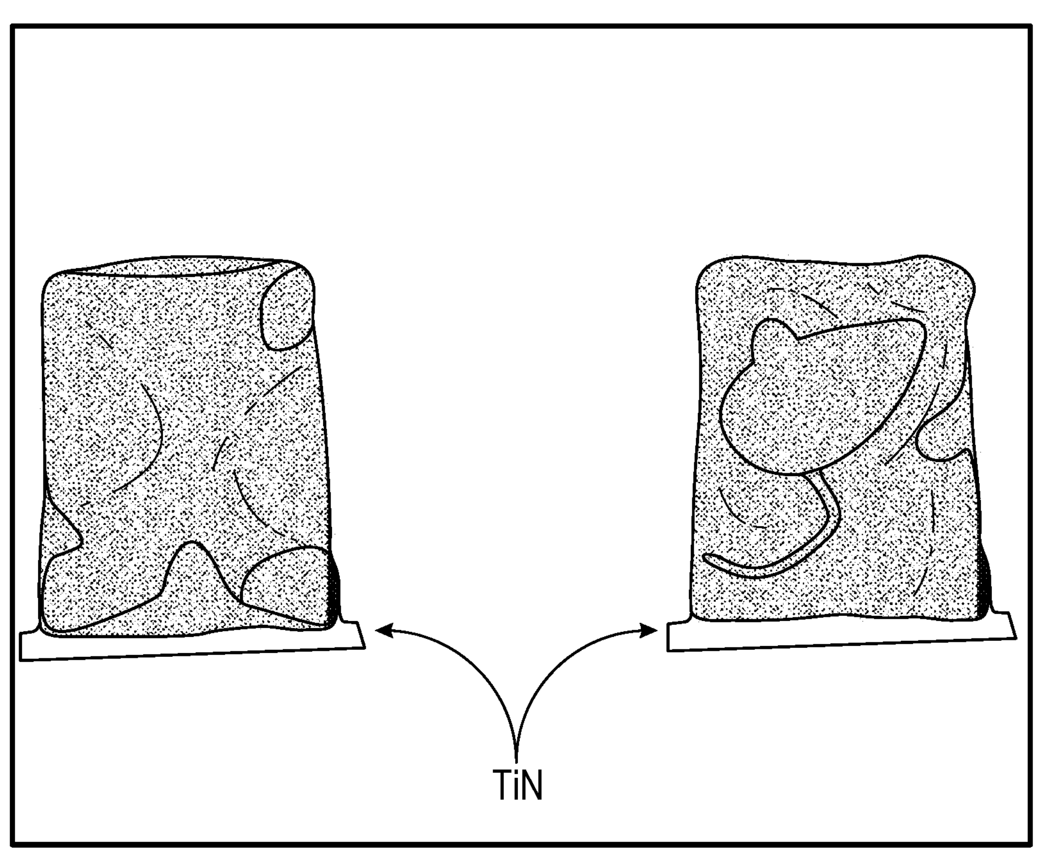
FIG. 6 illustrates an image of a protrusion of TiN at a stage of formation.

FIG. 6 illustrates a scan 600 showing a protrusion of TiN. As illustrated, post Failure Analysis (e.g., such as a SEM/TEM Analysis (FA)), there are some TiN protrusions post array thermal which may cause bin failure or larger variation. Accordingly, in some implementations herein, a thin SiN liner spacer is utilized for protecting the TiN and SiN and/or preventing the B from diffusing transversely.

Figures 7A, 7B, 7C:
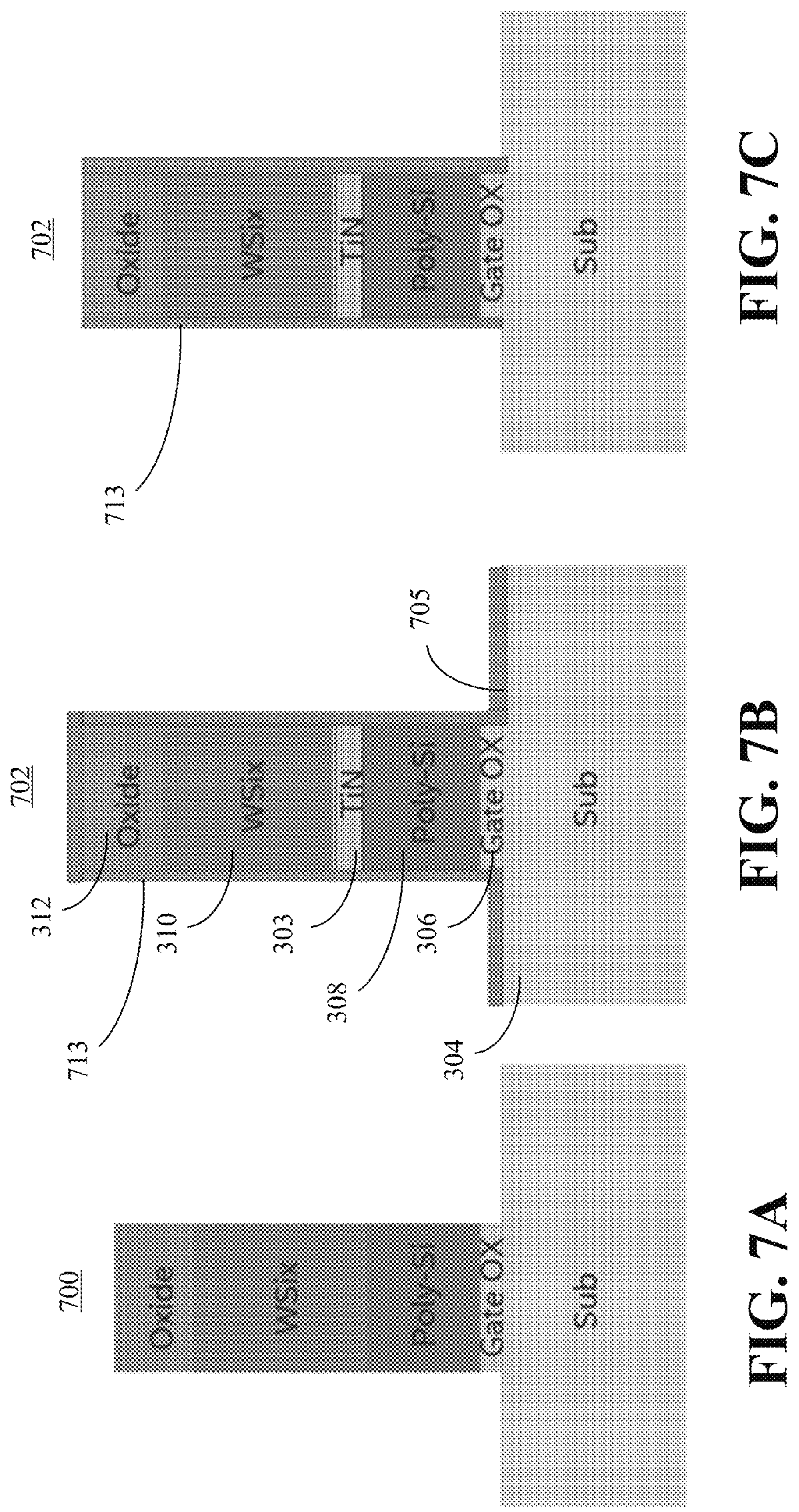
FIGS. 7A-7C illustrate one example implementation of SiN+TiN according to an embodiment at various stages of formation.

FIGS. 7A and 7B-7C illustrate a comparison of a current PMOS gate stack 700 (in FIG. 7A) and a TiN barrier in a PMOS gate stack 702 (in FIGS. 7B-7C) according to an embodiment.

As illustrated in FIG. 7A, a current PMOS gate stack 700 in a CuA with doped polysilicon typically suffers from a polysilicon depletion effect due to the diffusion of boron (B) in P-channel metal-oxide semiconductor (PMOS) post array thermal processing. Typically, the polysilicon depletion will affect CMOS performance and result in lower IO speed and higher power consumption.

Conversely, as illustrated in the implementation of FIGS. 7B-7C, a barrier 703 is utilized in the PMOS gate stack 702 to prevent the B in polysilicon out diffusion according to an embodiment. In some implementations, the barrier 303 is a TiN barrier. Such a barrier 303 has a thickness of a 30-40A, or the like, for example.

In the illustrated example, the PMOS gate stack 302 comprises a sequential set of layers comprising a gate oxide 306 adjacent a substrate 304, a polysilicon control gate 308 adjacent the gate oxide 306, the barrier 303 adjacent the polysilicon control gate 308, a conductive layer 310 adjacent the barrier 303, and an insulation cap 312 adjacent the conductive layer.

As described above, in some implementations, the memory die 200 (e.g., see FIG. 2) includes the memory array 202 (e.g., see FIG. 2) and a complementary metal-oxide semiconductor under array (e.g., as represented by peripheral circuitry 204) coupled to the memory array 202 (e.g., see FIG. 2). The complementary metal-oxide semiconductor under array (e.g., as represented by peripheral circuitry 204) includes a P-channel metal-oxide semiconductor gate stack on a substrate. In some implementations, such a P-channel metal-oxide semiconductor gate stack includes a polysilicon control gate and a titanium nitride barrier adjacent the polysilicon control gate.

In some implementations, the PMOS gate stack 702 includes a spacer 713 formed around the polysilicon control gate 308 and titanium nitride barrier 303. For example, a spacer comprising a silicon nitride material is formed around polysilicon control gate 308 and titanium nitride barrier 303.

FIGS. 7B-7C illustrate one example implementation of SiN+TiN according to an embodiment. FIG. 7B illustrates an initial deposit of a spacer layer deposit, which has portions 705 etched away to leave a spacer 713 formed around the polysilicon control gate 308 and titanium nitride barrier 303, as illustrated in FIG. 7C. As illustrated, spacer 713 is formed to bracket the PMOS gate stack 702 on opposing sides of the PMOS gate stack 702.

Figure 8:
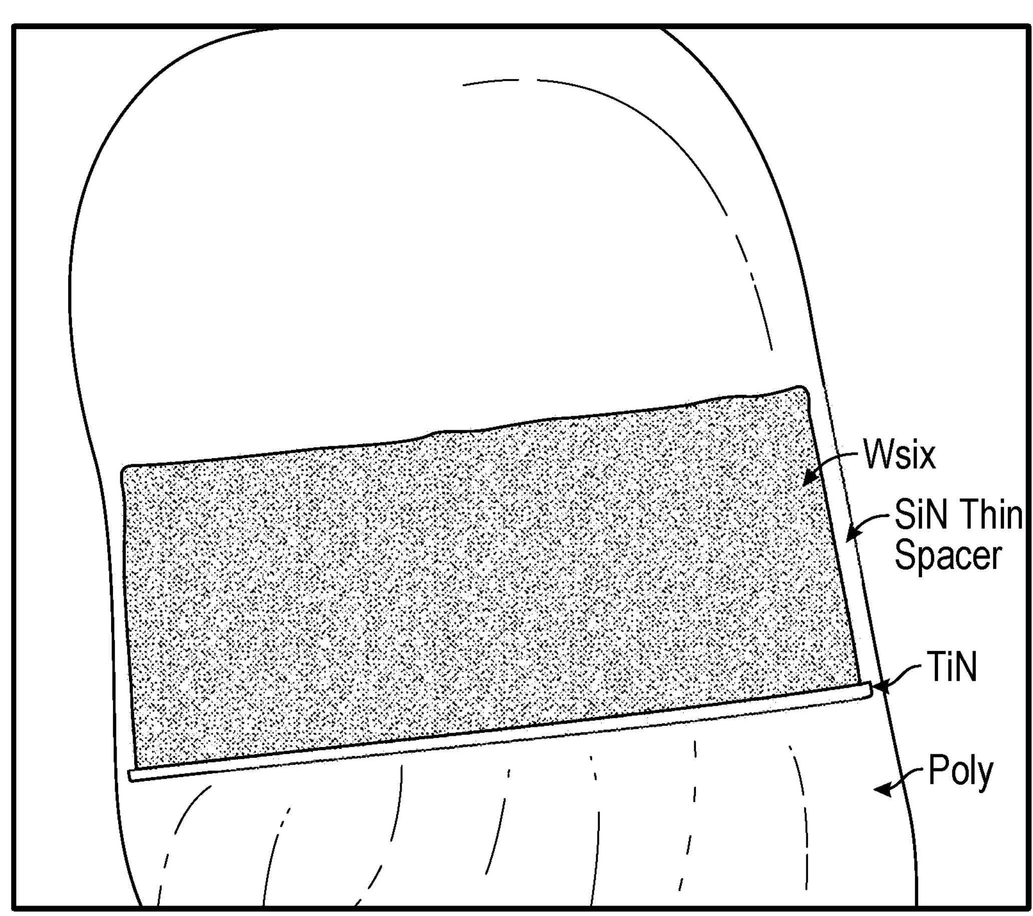
FIG. 8 illustrates a TEM image of an example implementation according to an embodiment.

FIG. 8 illustrates a TEM image of a memory device 800 of an example implementation according to an embodiment. As illustrated, the TiN is inserted between the polysilicon and Wsix, and SiN spacer is added to protect the gate.

Figure 9:
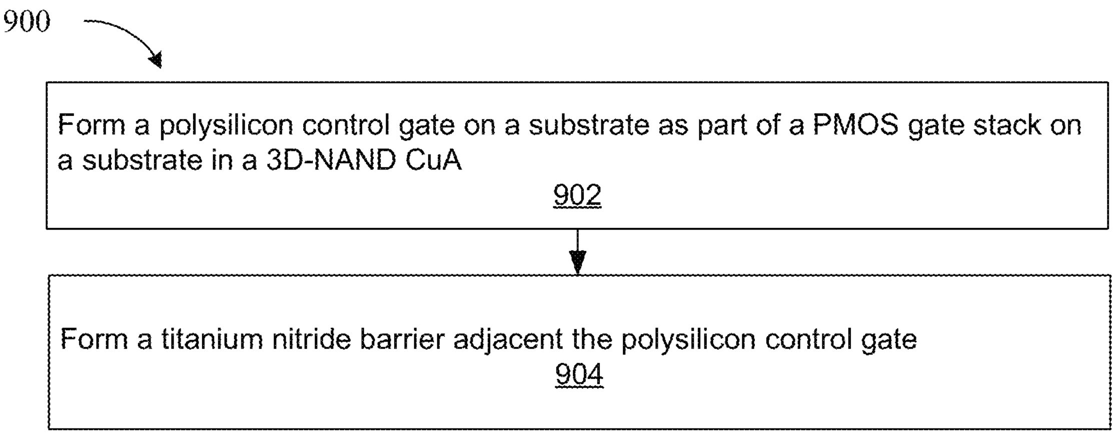
FIG. 9 is a flowchart of an example method of forming a memory device according to an embodiment.

FIG. 9 is a flowchart of an example method 900 of forming a memory device according to an embodiment. The method 900 may generally be implemented to form a memory device, such as, for example, a memory device including PMOS gate stack 702 (e.g., see FIGS. 7B-7C) and/or the memory device 800 (e.g., see FIG. 8).

Illustrated processing block 902 provides for forming a polysilicon control gate. For example, a polysilicon control gate is formed as part of a P-channel metal-oxide semiconductor gate stack on a substrate in a complementary metal-oxide semiconductor under array in a memory die.

Illustrated processing block 904 provides for forming barrier adjacent the polysilicon control gate. For example, a titanium nitride barrier is formed adjacent the polysilicon control gate.

In some implementations, the P-channel metal-oxide semiconductor gate stack comprises a sequential set of layers comprising a gate oxide adjacent the substrate, the polysilicon control gate adjacent the gate oxide, the titanium nitride barrier adjacent the polysilicon control gate, a conductive layer adjacent the titanium nitride barrier, and an insulation cap adjacent the conductive layer.

In some examples, the titanium nitride barrier is formed between the polysilicon control gate and a conductive layer, and where the conductive layer comprises a tungsten silicide material.

In some implementations, a spacer is formed around the polysilicon gate and titanium nitride barrier, where the spacer comprises a silicon nitride material.

In some examples, the memory die comprises 3D-NAND memory.

In some implementations, the polysilicon control gate is doped with boron.

In some examples, the conductive layer comprises a tungsten silicide material, and Additional details regarding the various implementations of the method 900 are discussed below with regard to FIGS. 10-12.

Figure 10:
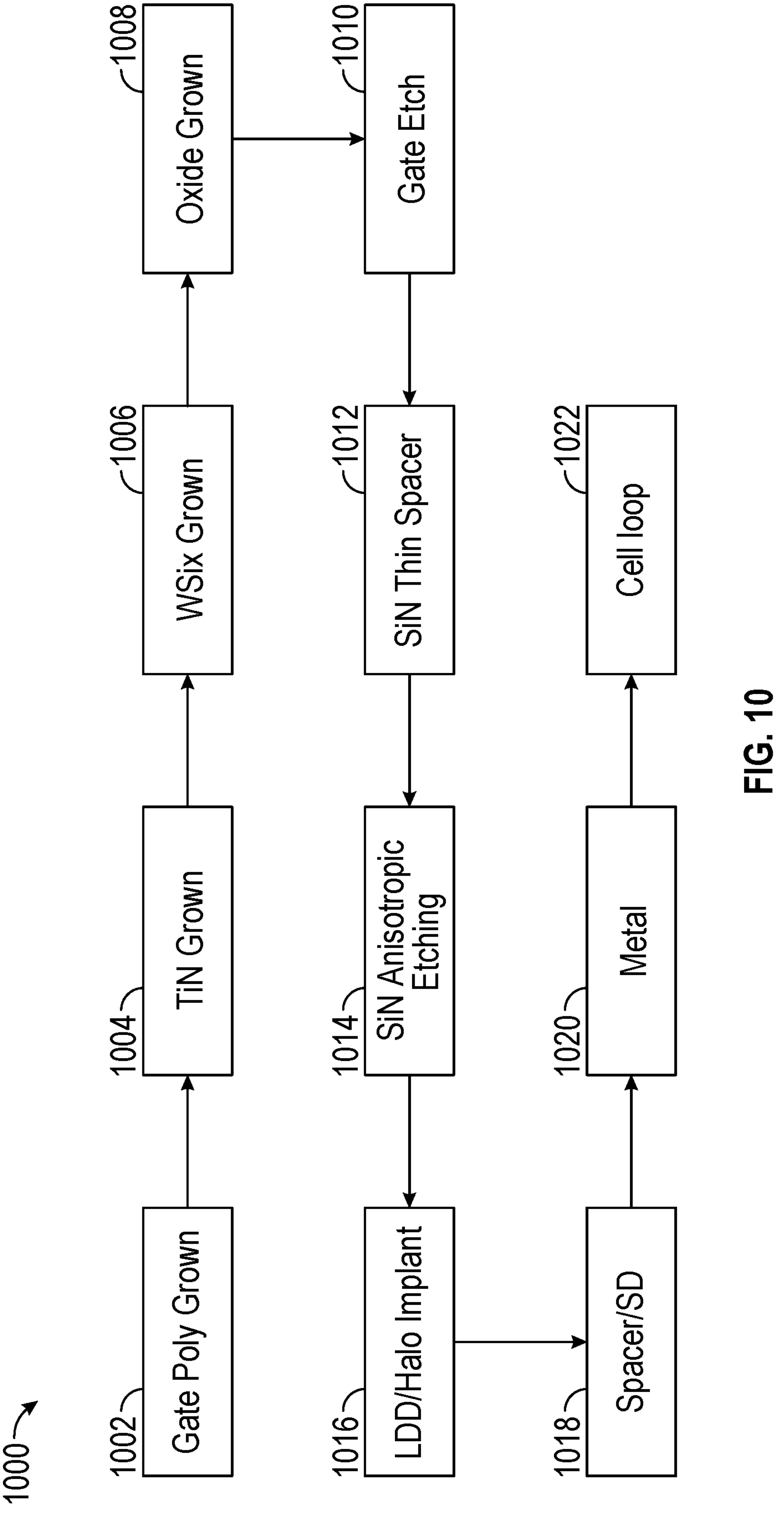
FIG. 10 is another flowchart of an example method of forming a memory device according to an embodiment.

FIG. 10 is another flowchart of an example method 1000 of forming a memory device according to an embodiment. The method 1000 may generally be implemented to form a memory device, such as, for example, a memory device including PMOS gate stack 702 (e.g., see FIGS. 7B-7C) and/or the memory device 800 (e.g., see FIG. 8).

Illustrated processing block 1002 provides for growing a gate polysilicon.

Illustrated processing block 1004 provides for growing a barrier layer. For example, a titanium nitride barrier is formed adjacent the polysilicon control gate.

Illustrated processing block 1006 provides for growing a conductive layer. For example, a conductive layer comprising a tungsten silicide material is grown adjacent the titanium nitride barrier.

Illustrated processing block 1008 provides for growing an insulation cap. For example, an insulation cap comprising an oxide material is grown adjacent the conductive layer.

Illustrated processing block 1010 provides for etching the PMOS gate stack.

Illustrated processing block 1012 provides for forming a thin spacer layer. For example, a spacer is formed around the polysilicon gate and titanium nitride barrier, where the spacer comprises a silicon nitride material.

Illustrated processing block 1014 provides for removing sacrificial portions of the thin spacer layer. For example, a portion of the thin spacer layer is removed via anisotropic etching.

Illustrated processing block 1016 provides for implant of "LDD/Halo," which refers to an implant for a light-doped drain and a pocket dose to reduce a punch through, for example.

Illustrated processing block 1018 provides for "spacer/SD" operations, which refers to a spacer to form a self-aligned implant for a source and drain implant.

Illustrated processing block 1020 provides for "metal" operations, which refers to a back end of line (BEOL) operation to provide interconnects of the CMOS.

Illustrated processing block 1022 provides for "cell loop" operations, which refers to a cell loop to perform oxide/nitride (ONON) and oxide/polysilicon (OPOP) film stack depositions (e.g., which may be done within pillar oxide and channel formation). All these process are typically done in a high temperature process.

Additional details regarding the various implementations of the method 900 are discussed below with regard to FIGS. 11 and 12.

Figure 11:
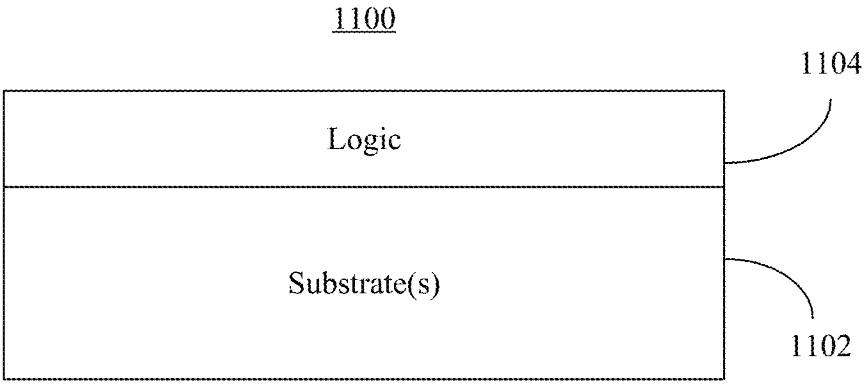
FIG. 11 is an illustration of an example of a semiconductor package apparatus according to an embodiment.

FIG. 11 shows a semiconductor apparatus 1100 (e.g., chip, die, and/or package). The illustrated apparatus 1100 includes one or more substrates 1102 (e.g., silicon, sapphire, gallium arsenide) and logic 1104 (e.g., transistor array and other integrated circuit/IC components) coupled to the substrate(s) 1102. In an embodiment, the logic 1104 implements one or more aspects of a memory device including PMOS gate stack 702 (e.g., see FIGS. 7B-7C) and/or the memory device 800 (e.g., see FIG. 8), already discussed.

In one example, the logic 1104 includes transistor channel regions that are positioned (e.g., embedded) within the substrate(s) 1102. Thus, the interface between the logic 1104 and the substrate 1102 may not be an abrupt junction. The logic 1104 may also be considered to include an epitaxial layer that is grown on an initial wafer of the substrate 1102.

Figure 12:
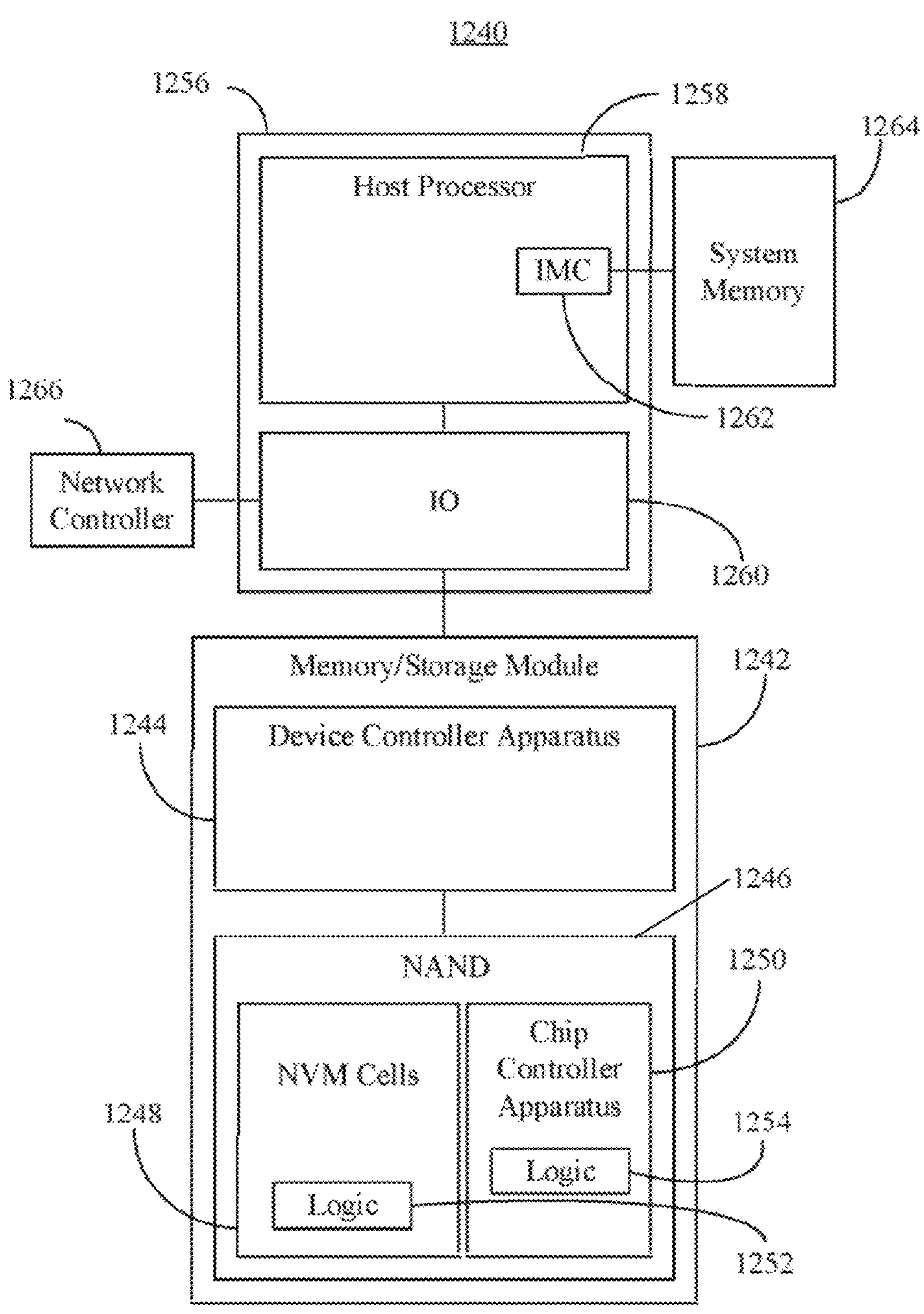
FIG. 12 is a block diagram of an example of a performance-enhanced computing system according to an embodiment.

Turning now to FIG. 12, a performance-enhanced computing system 1240 is shown. In the illustrated example, a solid state drive (SSD) 1242 includes a device controller apparatus 1244 that is coupled to a NAND 1246. The illustrated NAND 1246 includes a memory device 1248 having a set of multi-level NVM cells and logic 1252 (e.g., transistor array and other integrated circuit/IC components coupled to one or more substrates containing silicon, sapphire and/or gallium arsenide), and a chip controller apparatus 1250 that includes logic 1254. The logic 1254 may include one or more of configurable or fixed-functionality hardware.

The illustrated system 1240 also includes a system on chip (SoC) 1256 having a host processor 1258 (e.g., central processing unit/CPU) and an input/output (I/O) module 1260. The host processor 1258 may include an integrated memory controller 1262 (WIC) that communicates with system memory 1264 (e.g., RAM dual inline memory modules/DIMMs). The illustrated IO module 1260 is coupled to the SSD 1242 as well as other system components such as a network controller 1266.

In some embodiments, the NAND 1246 implements one or more aspects of a memory device including PMOS gate stack 702 (e.g., see FIGS. 7B-7C) and/or the memory device 800 (e.g., see FIG. 8), already discussed.

Additional Notes and Examples

Example 1 includes a memory die comprising: a memory array and a complementary metal-oxide semiconductor under array coupled to the memory array. The complementary metal-oxide semiconductor under array comprising a P-channel metal-oxide semiconductor gate stack on a substrate. The P-channel metal-oxide semiconductor gate stack comprising: a polysilicon control gate and a titanium nitride barrier adjacent the polysilicon control gate.

Example 2 includes the memory die of Example 1, further comprising: a spacer formed around the polysilicon gate and titanium nitride barrier, where the spacer comprises a silicon nitride material.

Example 3 includes the memory die of any one of Examples 1 to 2, where the titanium nitride barrier is formed between the polysilicon control gate and a conductive layer, and where the conductive layer comprises a tungsten silicide material.

Example 4 includes the memory die of any one of Examples 1 to 3, where the P-channel metal-oxide semiconductor gate stack comprises a sequential set of layers comprising a gate oxide adjacent the substrate, the polysilicon control gate adjacent the gate oxide, the titanium nitride barrier adjacent the polysilicon control gate, a conductive layer adjacent the titanium nitride barrier, and an insulation cap adjacent the conductive layer.

Example 5 includes the memory die of any one of Examples 1 to 4, where the memory die comprises 3D-NAND memory.

Example 6 includes the memory die of Example 1, further comprising: a spacer formed around the polysilicon gate and titanium nitride barrier, where the spacer comprises a silicon nitride material. The P-channel metal-oxide semiconductor gate stack comprises a sequential set of layers comprising a gate oxide adjacent the substrate, the polysilicon control gate adjacent the gate oxide, the titanium nitride barrier adjacent the polysilicon control gate, a conductive layer adjacent the titanium nitride barrier, and an insulation cap adjacent the conductive layer. The polysilicon control gate is doped with boron. The conductive layer comprises a tungsten silicide material. The memory die comprises 3D-NAND memory.

Example 7 includes a solid state drive (SSD) comprising: a memory controller and a memory device coupled to the memory controller. The memory device comprising: a memory array and a complementary metal-oxide semiconductor under array coupled to the memory array. The complementary metal-oxide semiconductor under array comprising a P-channel metal-oxide semiconductor gate stack on a substrate. The P-channel metal-oxide semiconductor gate stack comprising: a polysilicon control gate and a titanium nitride barrier adjacent the polysilicon control gate.

Example 8 includes the solid state drive (SSD) of Example 7, further comprising: a spacer formed around the polysilicon gate and titanium nitride barrier, where the spacer comprises a silicon nitride material.

Example 9 includes the solid state drive (SSD) of any one of Examples 7 to 8, where the titanium nitride barrier is formed between the polysilicon control gate and a conductive layer, and where the conductive layer comprises a tungsten silicide material.

Example 10 includes the solid state drive (SSD) of any one of Examples 7 to 9, where the P-channel metal-oxide semiconductor gate stack comprises a sequential set of layers comprising a gate oxide adjacent the substrate, the polysilicon control gate adjacent the gate oxide, the titanium nitride barrier adjacent the polysilicon control gate, a conductive layer adjacent the titanium nitride barrier, and an insulation cap adjacent the conductive layer.

Example 11 includes the solid state drive (SSD) of any one of Examples 7 to 10, where the memory device comprises 3D-NAND memory.

Example 12 includes the solid state drive (SSD) of Example 7, further comprising: a spacer formed around the polysilicon gate and titanium nitride barrier, where the spacer comprises a silicon nitride material. The P-channel metal-oxide semiconductor gate stack comprises a sequential set of layers comprising a gate oxide adjacent the substrate, the polysilicon control gate adjacent the gate oxide, the titanium nitride barrier adjacent the polysilicon control gate, a conductive layer adjacent the titanium nitride barrier, and an insulation cap adjacent the conductive layer. The polysilicon control gate is doped with boron. The conductive layer comprises a tungsten silicide material. The memory die comprises 3D-NAND memory.

Example 13 includes a method comprising: forming a polysilicon control gate as part of a P-channel metal-oxide semiconductor gate stack on a substrate in a complementary metal-oxide semiconductor under array in a memory die; and forming a titanium nitride barrier adjacent the polysilicon control gate.

Example 14 includes method of Example 13, further comprising: forming a spacer around the polysilicon gate and titanium nitride barrier, where the spacer comprises a silicon nitride material.

Example 15 includes method of any one of Examples 13 to 14, where the titanium nitride barrier is formed between the polysilicon control gate and a conductive layer, and where the conductive layer comprises a tungsten silicide material.

Example 16 includes method of any one of Examples 13 to 15, where the P-channel metal-oxide semiconductor gate stack comprises a sequential set of layers comprising a gate oxide adjacent the substrate, the polysilicon control gate adjacent the gate oxide, the titanium nitride barrier adjacent the polysilicon control gate, a conductive layer adjacent the titanium nitride barrier, and an insulation cap adjacent the conductive layer.

Example 17 includes method of claim of any one of Examples 13 to 16, where the memory die comprises 3D-NAND memory.

Example 18 includes method of claim 13, further comprising forming a spacer around the polysilicon gate and titanium nitride barrier, where the spacer comprises a silicon nitride material. The P-channel metal-oxide semiconductor gate stack comprises a sequential set of layers comprising a gate oxide adjacent the substrate, the polysilicon control gate adjacent the gate oxide, the titanium nitride barrier adjacent the polysilicon control gate, a conductive layer adjacent the titanium nitride barrier, and an insulation cap adjacent the conductive layer. The polysilicon control gate is doped with boron. The conductive layer comprises a tungsten silicide material. The memory die comprises 3D-NAND memory.

Example 19 includes a machine-readable storage comprising machine-readable instructions, which when executed, implement a method or realize an apparatus as claimed in any preceding claim.

Example 20 includes an apparatus comprising means for performing the method of any one of Examples 13 to 18.

Technology described herein therefore provides the capability to form a gate polysilicon for 3D-NAND CuA on a substrate with a barrier and spacer structure. For example, the technology includes forming a TiN barrier adjacent to the gate polysilicon and forming a SiN spacer around the polysilicon control gate and TiN barrier. Advantageously, such techniques reduce polysilicon depletion effect and improve PMOS (e.g., with about a 17% performance boost). Additionally, or alternatively, some implementations herein provide improved user experience and improved performance through improved High Input/Output speed and/or decreased power consumption.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A memory die comprising:

a memory array; and a complementary metal-oxide semiconductor under array coupled to the memory array, the complementary metal-oxide semiconductor under array comprising a P-channel metal-oxide semiconductor gate stack on a substrate, the P-channel metal-oxide semiconductor gate stack comprising:

a polysilicon control gate;

a titanium nitride barrier adjacent to the polysilicon control gate;

a tungsten silicide conductive layer adjacent to the titanium nitride barrier;

an insulation cap immediately coupled to a top surface of the tungsten silicide conductive layer; and a spacer adjacent to at least an edge of the insulation cap, the spacer including silicon nitride.

2. The memory die of claim 1, wherein the spacer is formed around the polysilicon control gate and titanium nitride barrier.

3. The memory die of claim 1, wherein the titanium nitride barrier is formed between the polysilicon control gate and the tungsten silicide conductive layer.

4. The memory die of claim 1, wherein the P-channel metal-oxide semiconductor gate stack comprises a sequential set of layers comprising a gate oxide adjacent to the substrate, the polysilicon control gate adjacent to the gate oxide, the titanium nitride barrier adjacent to the polysilicon control gate, the tungsten silicide conductive layer adjacent to the titanium nitride barrier, and the insulation cap adjacent to the tungsten silicide conductive layer.

5. The memory die of claim 1, wherein the memory die comprises 3D-NAND memory.

6. The memory die of claim 1 wherein the spacer is formed around the polysilicon control gate and titanium nitride barrier, wherein the P-channel metal-oxide semiconductor gate stack comprises a sequential set of layers comprising a gate oxide adjacent to the substrate, the polysilicon control gate adjacent to the gate oxide, the titanium nitride barrier adjacent to the polysilicon control gate, the tungsten silicide conductive layer adjacent to the titanium nitride barrier, and the insulation cap adjacent to the tungsten silicide conductive layer, wherein the polysilicon control gate is doped with boron, and wherein the memory die comprises 3D-NAND memory.

7. The memory die of claim 1, wherein the titanium nitride barrier has a thickness in a range of 30-40 Angstroms.

8. A solid state drive, comprising:

a memory controller; and a memory device coupled to the memory controller, the memory device comprising:

a memory array; and a complementary metal-oxide semiconductor under array coupled to the memory array, the complementary metal-oxide semiconductor under array comprising a P-channel metal-oxide semiconductor gate stack on a substrate, the P-channel metal-oxide semiconductor gate stack comprising:

a polysilicon control gate;

a titanium nitride barrier adjacent to the polysilicon control gate;

a tungsten silicide conductive layer adjacent to the titanium nitride barrier;

an insulation cap immediately coupled to a top surface of the tungsten silicide conductive layer; and a spacer adjacent to at least an edge of the insulation cap, the spacer including silicon nitride.

9. The solid state drive of claim 8, wherein the spacer is formed around the polysilicon control gate and titanium nitride barrier.

10. The solid state drive of claim 8, wherein the titanium nitride barrier is formed between the polysilicon control gate and the tungsten silicide conductive layer.

11. The solid state drive of claim 8, wherein the P-channel metal-oxide semiconductor gate stack comprises a sequential set of layers comprising a gate oxide adjacent to the substrate, the polysilicon control gate adjacent to the gate oxide, the titanium nitride barrier adjacent to the polysilicon control gate, the tungsten silicide conductive layer adjacent to the titanium nitride barrier, and the insulation cap adjacent to the tungsten silicide conductive layer.

12. The solid state drive of claim 8, wherein the memory device comprises 3D-NAND memory.

13. The solid state drive of claim 8, the spacer is formed around the polysilicon control gate and titanium nitride barrier, wherein the spacer comprises a silicon nitride material, wherein the P-channel metal-oxide semiconductor gate stack comprises a sequential set of layers comprising a gate oxide adjacent to the substrate, the polysilicon control gate adjacent to the gate oxide, the titanium nitride barrier adjacent to the polysilicon control gate, the tungsten silicide conductive layer adjacent to the titanium nitride barrier, and the insulation cap adjacent to the tungsten silicide conductive layer, wherein the polysilicon control gate is doped with boron, and wherein the memory device comprises 3D-NAND memory.

14. The solid state drive of claim 8, wherein the titanium nitride barrier has a thickness in a range of 30-40 Angstroms.

15. A method comprising:

forming a polysilicon control gate as part of a P-channel metal-oxide semiconductor gate stack on a substrate in a complementary metal-oxide semiconductor under array in a memory die; and forming a titanium nitride barrier adjacent the polysilicon control gate;

wherein the P-channel metal-oxide semiconductor gate stack comprising:

the polysilicon control gate;

the titanium nitride barrier adjacent to the polysilicon control gate;

a tungsten silicide conductive layer adjacent to the titanium nitride barrier;

an insulation cap immediately coupled to a top surface of the tungsten silicide conductive layer; and a spacer adjacent to at least an edge of the insulation cap, the spacer including silicon nitride.

16. The method of claim 15, further comprising:

forming the spacer around the polysilicon control gate and titanium nitride barrier.

17. The method of claim 15, wherein the titanium nitride barrier is formed between the polysilicon control gate and the tungsten silicide conductive layer.

18. The method of claim 15, wherein the P-channel metal-oxide semiconductor gate stack comprises a sequential set of layers comprising a gate oxide adjacent the substrate, the polysilicon control gate adjacent the gate oxide, the titanium nitride barrier adjacent the polysilicon control gate, the tungsten silicide conductive layer adjacent the titanium nitride barrier, and the insulation cap adjacent the tungsten silicide conductive layer.

19. The method of claim 15, wherein the memory die comprises 3D-NAND memory.

20. The method of claim 15, further comprising:

forming the spacer around the polysilicon control gate and titanium nitride barrier, wherein the spacer comprises a silicon nitride material, wherein the P-channel metal-oxide semiconductor gate stack comprises a sequential set of layers comprising a gate oxide adjacent the substrate, the polysilicon control gate adjacent the gate oxide, the titanium nitride barrier adjacent the polysilicon control gate, the tungsten silicide conductive layer adjacent the titanium nitride barrier, and the insulation cap adjacent the tungsten silicide conductive layer, wherein the polysilicon control gate is doped with boron, and wherein the memory die comprises 3D-NAND memory.

* * * * *